United States Patent
Miyazaki et al.

(10) Patent No.: US 12,535,432 B2
(45) Date of Patent: Jan. 27, 2026

(54) MANUFACTURING METHOD AND INSPECTION METHOD OF SEMICONDUCTOR DEVICE INCLUDING OBTAINING AN IMAGE OF THE DEVICE AND DETERMINING DEFECTS OF A METAL ELECTRODE

(71) Applicants: FUJI ELECTRIC CO., LTD., Kanagawa (JP); DENSO Corporation, Aichi (JP)

(72) Inventors: Masayuki Miyazaki, Matsumoto (JP); Taketo Tsuji, Chiba (JP); Makoto Terakawa, Matsumoto (JP); Kensuke Hata, Aichi (JP); Tomohiro Mimura, Aichi (JP)

(73) Assignees: FUJI ELECTRIC CO., LTD., Kanagawa (JP); DENSO CORPORATION, Aichi (JP)

( * ) Notice: Subject to any disclaimer, the term of this patent is extended or adjusted under 35 U.S.C. 154(b) by 749 days.

(21) Appl. No.: 17/889,350

(22) Filed: Aug. 16, 2022

(65) Prior Publication Data

US 2023/0074595 A1 Mar. 9, 2023

(30) Foreign Application Priority Data

Sep. 7, 2021 (JP) .................. 2021-145806

(51) Int. Cl.
*G01N 21/95* (2006.01)
*H01L 21/66* (2006.01)

(52) U.S. Cl.
CPC ......... *G01N 21/9501* (2013.01); *H01L 22/12* (2013.01)

(58) Field of Classification Search
CPC ............ G01N 21/9501; H01L 22/12
See application file for complete search history.

(56) References Cited

U.S. PATENT DOCUMENTS

| 2002/0036771 A1 | 3/2002 | Sato |
| 2012/0112066 A1 | 5/2012 | Ogiso |
| 2013/0082174 A1 | 4/2013 | Chen |

(Continued)

FOREIGN PATENT DOCUMENTS

| JP | 2002098645 A | 4/2002 |
| JP | 2009128325 A | 6/2009 |

(Continued)

OTHER PUBLICATIONS

Office Action issued for counterpart Japanese Application No. 2021-145806, transmitted from the Japanese Patent Office on Dec. 24, 2024 (drafted on Dec. 18, 2024).

*Primary Examiner* — Davienne N Monbleau
*Assistant Examiner* — John Patrick Cornely

(57) ABSTRACT

Provided is a manufacturing method of a semiconductor device having a semiconductor substrate. The manufacturing method includes forming an interlayer insulating film above the semiconductor substrate; forming a metal electrode above the interlayer insulating film; acquiring an image of the metal electrode and detecting defect candidates on a surface of the metal electrode based on the image; and performing inspection by determining a quality of the semiconductor device, based on height information of each of the detected defect candidates in a direction perpendicular to the surface of the metal electrode.

19 Claims, 14 Drawing Sheets

(56) References Cited

U.S. PATENT DOCUMENTS

| | | |
|---|---|---|
| 2013/0196453 A1 | 8/2013 | Izuha |
| 2019/0097030 A1 | 3/2019 | Miyata |
| 2019/0172757 A1 | 6/2019 | Tsuchiya |
| 2022/0156911 A1* | 5/2022 | Chen .................... G06T 7/0004 |

FOREIGN PATENT DOCUMENTS

| | | |
|---|---|---|
| JP | 2012112927 A | 6/2012 |
| JP | 2013157472 A | 8/2013 |
| JP | 2015500979 A | 1/2015 |
| JP | 2018091807 A | 6/2018 |
| JP | 2020126937 A | 8/2020 |
| WO | 2018029786 A1 | 2/2018 |
| WO | 2018056233 A1 | 3/2018 |
| WO | 2018104931 A1 | 6/2018 |

* cited by examiner

| 1 | 1 | 2 | 2 | 2 | 2 | 2 |
|---|---|---|---|---|---|---|
| 1 | 1 | 2 | 2 | 2 | 2 | 2 |
| 1 | 1 | 2 | 2 | 2 | 2 | 2 |
| 2 | 2 | 2 | 2 | 2 | 2 | 2 |
| 2 | 2 | 2 | 2 | 2 | 5 | 5 |
| 2 | 2 | 2 | 3 | 3 | 5 | 5 |
| 2 | 2 | 2 | 3 | 3 | 4 | 4 |
| 2 | 2 | 2 | 3 | 3 | 4 | 4 |

MANUFACTURING METHOD AND INSPECTION METHOD OF SEMICONDUCTOR DEVICE INCLUDING OBTAINING AN IMAGE OF THE DEVICE AND DETERMINING DEFECTS OF A METAL ELECTRODE

The contents of the following Japanese patent application(s) are incorporated herein by reference:
No. 2021-145806 filed in JP on Sep. 7, 2021.

BACKGROUND

1. Technical Field

The present invention relates to a manufacturing method and an inspection method of a semiconductor device.

2. Related Art

Conventionally, in the manufacture of a semiconductor device, known is a technology of detecting the presence or absence of a defect on a surface of the semiconductor device by an image (for example, refer to Patent Document 1). In addition, known is a technology of determining a defect on a surface of a semiconductor device by laser (for example, refer to Patent Document 2).
Patent Document 1: Japanese Patent Application Publication No. 2020-126937
Patent Document 2: Japanese Patent Application Publication No. 2002-98645

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments are essential to the solution of the invention. Note that, in the present specification and drawings, the elements having substantially the same functions and configurations are denoted with the same reference signs, and the overlapping descriptions thereof are omitted. In addition, the elements that are not directly relevant to the present invention are not shown. In addition, in one drawing, the element having the same function and configuration is representatively denoted with a reference sign, and the reference sign for the others may be omitted.

As used herein, one side in a direction parallel to a depth direction of a semiconductor substrate is referred to as 'upper' and the other side is referred to as 'lower'. One surface of two principal surfaces of a substrate, a layer or other member is referred to as 'upper surface', and the other surface is referred to as 'lower surface'. The 'upper' and 'lower' directions are not limited to a gravity direction or a direction at a time of mounting a semiconductor module.

As used herein, the technical matters may be described using orthogonal coordinate axes of X-axis, Y-axis and Z-axis. The orthogonal coordinate axes simply specify a relative position of a constitutional element, not limiting a specific direction. For example, the Z-axis does not limit a height direction with respect to the ground. Note that, the +Z-axis direction and the −Z-axis direction are opposite to each other. When the Z-axis direction is simply described without denoting +/−, it means a direction parallel to the +Z-axis and the −Z-axis. As used herein, the orthogonal axes parallel to an upper surface and a lower surface of the semiconductor substrate are defined as the X-axis and the Y-axis. In addition, the axis perpendicular to the upper surface and the lower surface of the semiconductor substrate is defined as the Z-axis. As used herein, the direction of the Z-axis may be referred to as a depth direction. In addition, as used herein, a direction parallel to the upper surface and the lower surface of the semiconductor substrate, including the X-axis and the Y-axis, may be referred to as a horizontal direction.

As used herein, when referred to as "same" or "equal", it may include a case where there is an error due to a manufacturing variation and the like. The error is, for example, within 10%.

Figure 1:
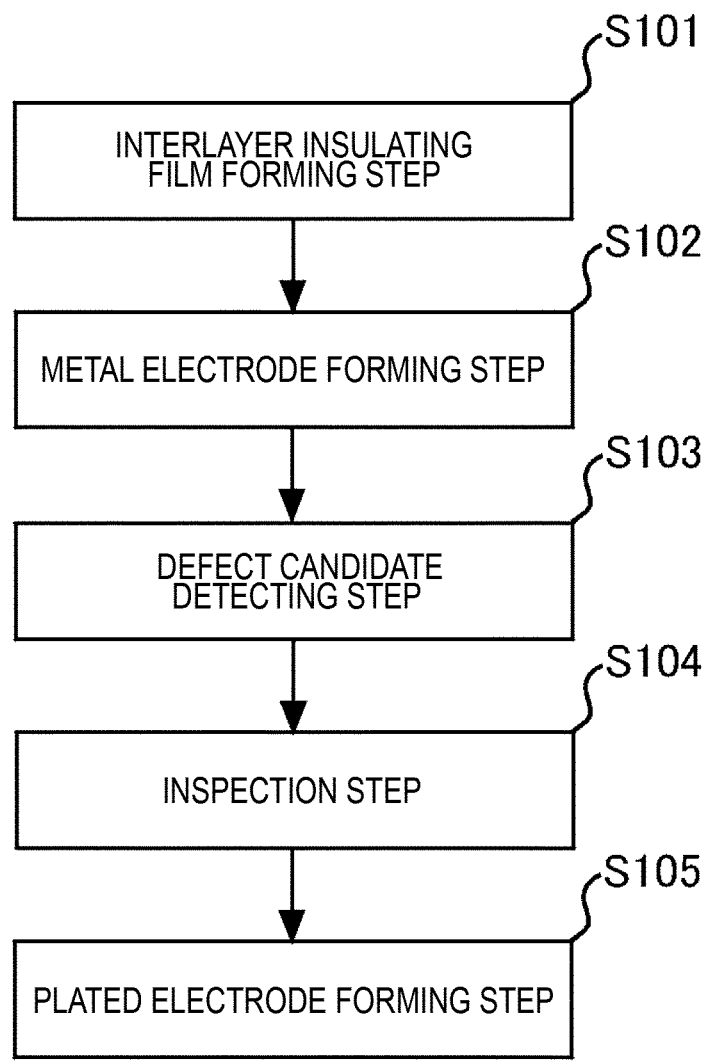
FIG. 1 is a diagram describing an example of a flowchart of a manufacturing method of a semiconductor device 100.
Figure 2:
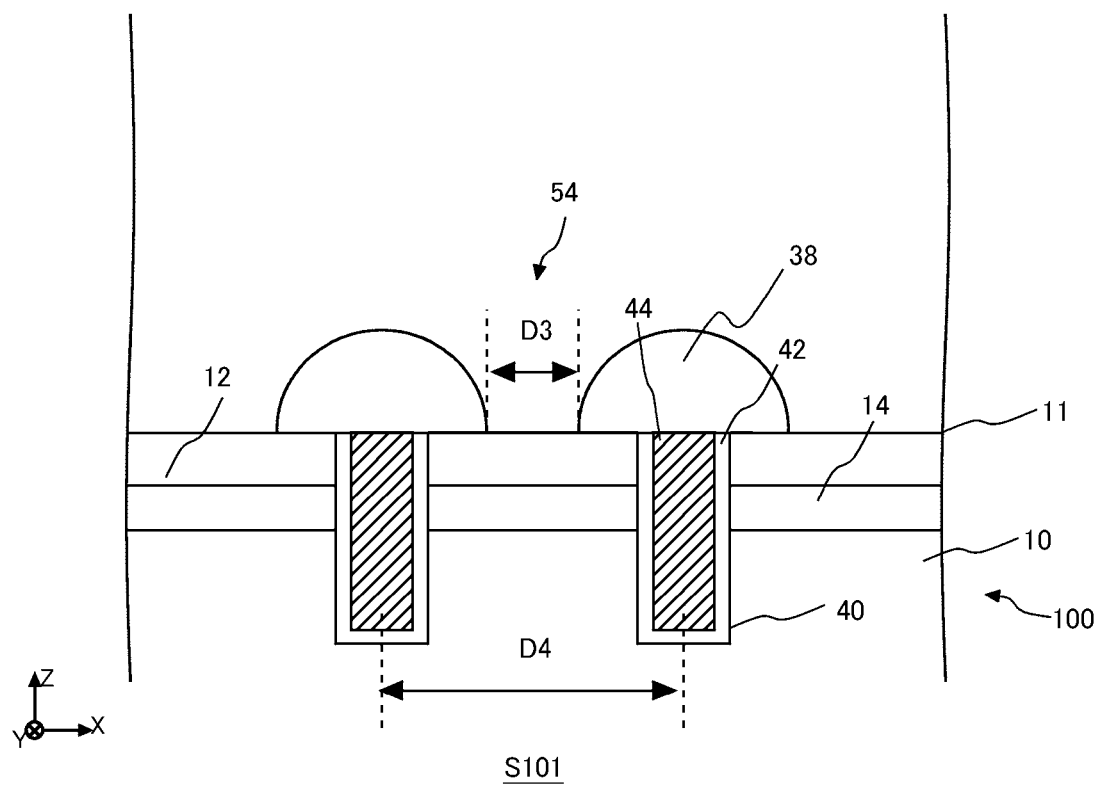
FIG. 2 is a diagram describing an example of an interlayer insulating film forming step S101.

FIG. 1 is a diagram describing an example of a flowchart of a manufacturing method of a semiconductor device 100 (refer to FIG. 2). The manufacturing method of the semiconductor device 100 includes an interlayer insulating film forming step S101, a metal electrode forming step S102, a defect candidate detecting step S103, an inspection step S104 and a plated electrode forming step S105. First, in FIGS. 2 to 4, the interlayer insulating film forming step S101, the metal electrode forming step S102, and the plated electrode forming step S105 are described.

FIG. 2 is a diagram describing an example of the interlayer insulating film forming step S101. FIG. 2 shows a part of the vicinity of a gate structure of the semiconductor device 100 after forming an interlayer insulating film 38.

As an example, the semiconductor device 100 is configured to function as a power conversion device such as an inverter. The semiconductor device 100 may include a MOS transistor. In the present example, the semiconductor device 100 includes an IEMOS (Implantation and Epitaxial Metal Oxide Semiconductor) transistor. The semiconductor device 100 may also include an insulated gate bipolar transistor (IGBT), a diode such as an FWD (Free Wheel Diode), and an RC (Reverse Conducting)-IGBT in which these are combined. The semiconductor device 100 may not be limited to these examples. The semiconductor device 100 may be a so-called power semiconductor element.

The semiconductor device 100 is provided on a semiconductor substrate 10. In the present example, the semiconductor substrate 10 is a substantially circular wafer, as seen from above. A plurality of semiconductor devices 100 may be provided on the semiconductor substrate 10. A plurality of semiconductor devices 100 may be manufactured by dicing the semiconductor substrate 10. The semiconductor substrate 10 is a substrate formed of a semiconductor material. In the present example, the semiconductor substrate 10 is a silicon carbide (SiC) substrate. The material of the semiconductor substrate 10 is not limited to silicon carbide. The material of the semiconductor substrate 10 may also be silicon. A plurality of semiconductor devices 100 may be provided on the semiconductor substrate 10. In FIG. 2, the semiconductor device 100 includes the semiconductor substrate 10. The semiconductor substrate 10 has an upper surface 11. A trench 40 may be formed in the upper surface 11 before the interlayer insulating film forming step S101. The trench 40 is a groove provided from the upper surface 11 of the semiconductor substrate 10 to an inside of the semiconductor substrate 10. The trench 40 may penetrate through a P type base region 14. The trench 40 is provided extending in the Y-axis direction. In addition, a plurality of trenches 40 are arranged at predetermined intervals in the X-axis direction.

The upper surface 11 of the semiconductor substrate 10 may be a surface in which a gate structure such as an IGBT and a MOS transistor is formed. The gate structure is a structure including, for example, at least one of a gate electrode 44, a gate insulating film 42, an N type source region 12, and a P type base region 14. In the example of FIG. 2, in the trench 40, the gate electrode 44 formed of polysilicon or the like and the gate insulating film 42 that insulates the gate electrode 44 and the semiconductor substrate 10 are provided. The gate structure may be formed before the interlayer insulating film forming step S101.

In the interlayer insulating film forming step S101, an interlayer insulating film 38 is formed above the semiconductor substrate 10. The interlayer insulating film 38 is a film including at least one layer of an insulating film such as silicate glass added with impurities of boron, phosphorous or the like, a thermally oxidized film and other insulating films.

In the present example, the interlayer insulating film 38 is formed on the upper surface 11. The interlayer insulating film 38 of the present example is configured to insulate the gate electrode 44 and a metal electrode 52 (refer to FIG. 3). The interlayer insulating film 38 may cover the trench 40. A part of the interlayer insulating film 38 may be formed in the trench 40. The interlayer insulating film 38 may not be formed in the trench 40. In addition, the interlayer insulating film 38 is configured to insulate the semiconductor substrate 10 and the metal electrode 52. The interlayer insulating film 38 may be provided with a contact hole 54 for connecting the semiconductor substrate 10 and the metal electrode 52. The interlayer insulating film 38 may be formed by a known method and may be patterned as shown in FIG. 2 by a known method.

An interval D3 between the interlayer insulating films 38 may be 0.25 μm or more. The interval D3 between the interlayer insulating films 38 may be the shortest distance between the interlayer insulating films 38. In the present example, the interval D3 between the interlayer insulating films 38 is an interval in the X-axis direction. The interval D3 between the interlayer insulating films 38 may be 2.5 μm or less.

In addition, a cell pitch D4 of the semiconductor device 100 may be 0.50 μm or more. The cell pitch D4 of the semiconductor device 100 may be a distance between centers of the trenches 40. In the present example, the distance between the centers of the trenches 40 is a distance in the X-axis direction. The cell pitch D4 of the semiconductor device 100 may be 5.0 μm or less.

Figure 3:
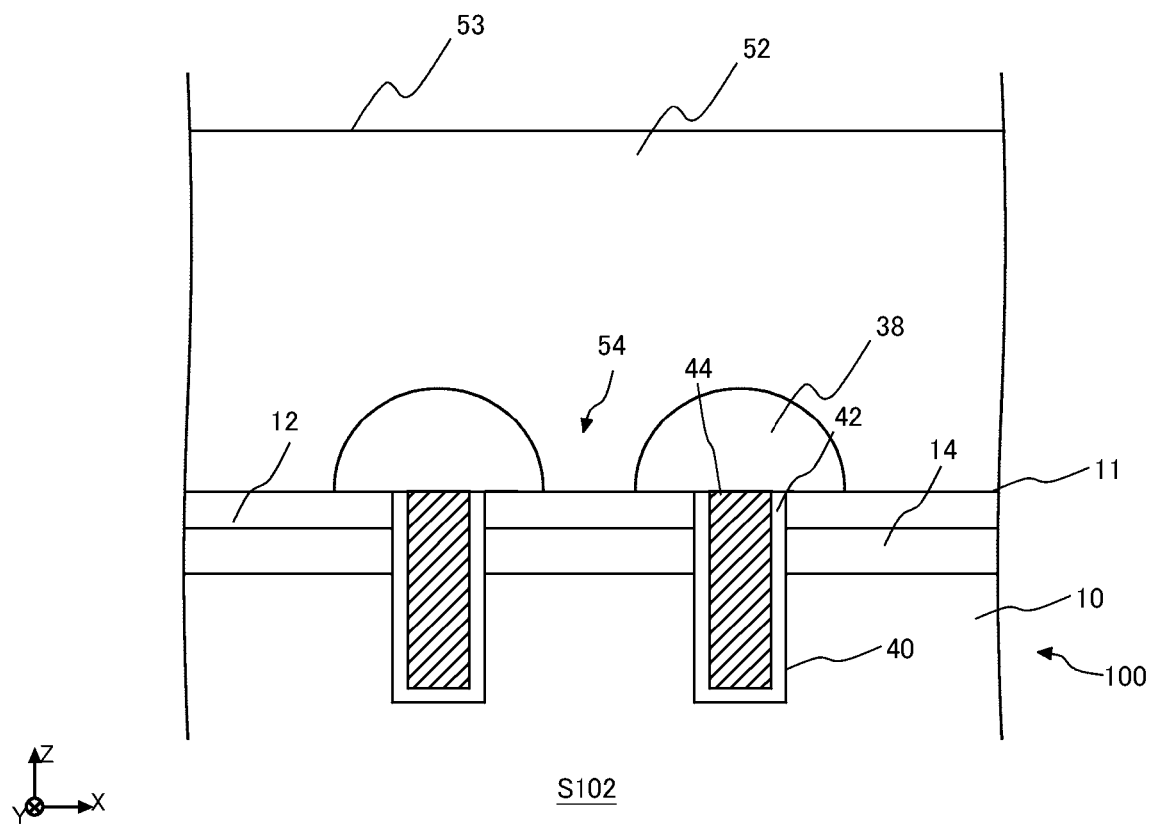
FIG. 3 is a diagram describing an example of a metal electrode forming step S102.

FIG. 3 is a diagram describing an example of the metal electrode forming step S102. FIG. 3 shows the semiconductor device 100 after forming a metal electrode 52.

In the metal electrode forming step S102, a metal electrode 52 is formed above the interlayer insulating film 38. In the present example, the metal electrode 52 is formed above the upper surface 11 and the interlayer insulating film 38. In the present example, the metal electrode 52 is connected to the semiconductor substrate 10 via the contact hole 54 between the interlayer insulating films 38. Note that, an upper surface of the metal electrode 52 is a surface 53.

The metal electrode 52 is an electrode including metal such as aluminum. In the present example, the metal electrode 52 is AlSi. The metal electrode 52 may be formed into a film by a known method.

Figure 4:
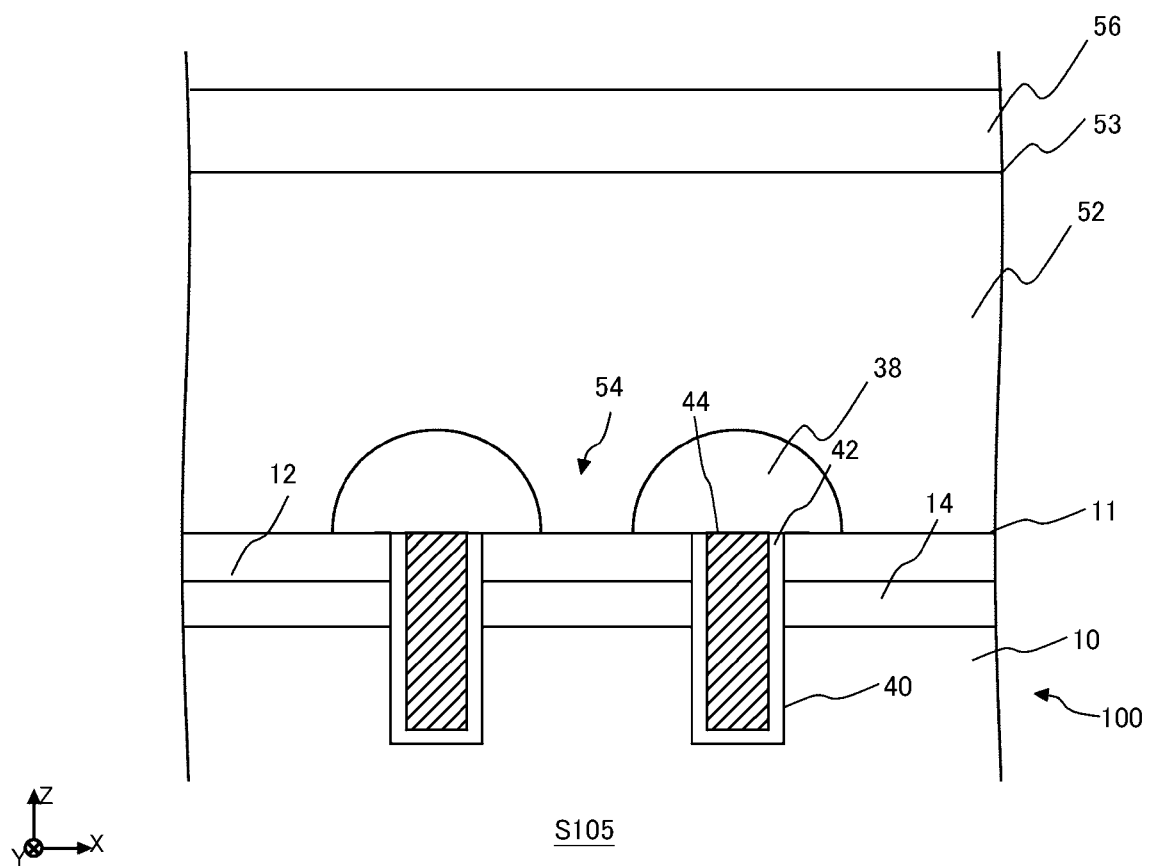
FIG. 4 is a diagram describing an example of a plated electrode forming step S105.

FIG. 4 is a diagram describing an example of the plated electrode forming step S105. FIG. 4 shows the semiconductor device 100 after forming a plated electrode 56.

In the plated electrode forming step S105, a plated electrode 56 is formed above the metal electrode 52. In the present example, the plated electrode 56 is formed on the surface 53 of the metal electrode 52. A stacked structure of the metal electrode 52 and the plated electrode 56 may function as an emitter electrode or a source electrode. The plated electrode 56 is, for example, NiAu plating. The plated electrode 56 may be formed by using a plating solution.

Figure 5:
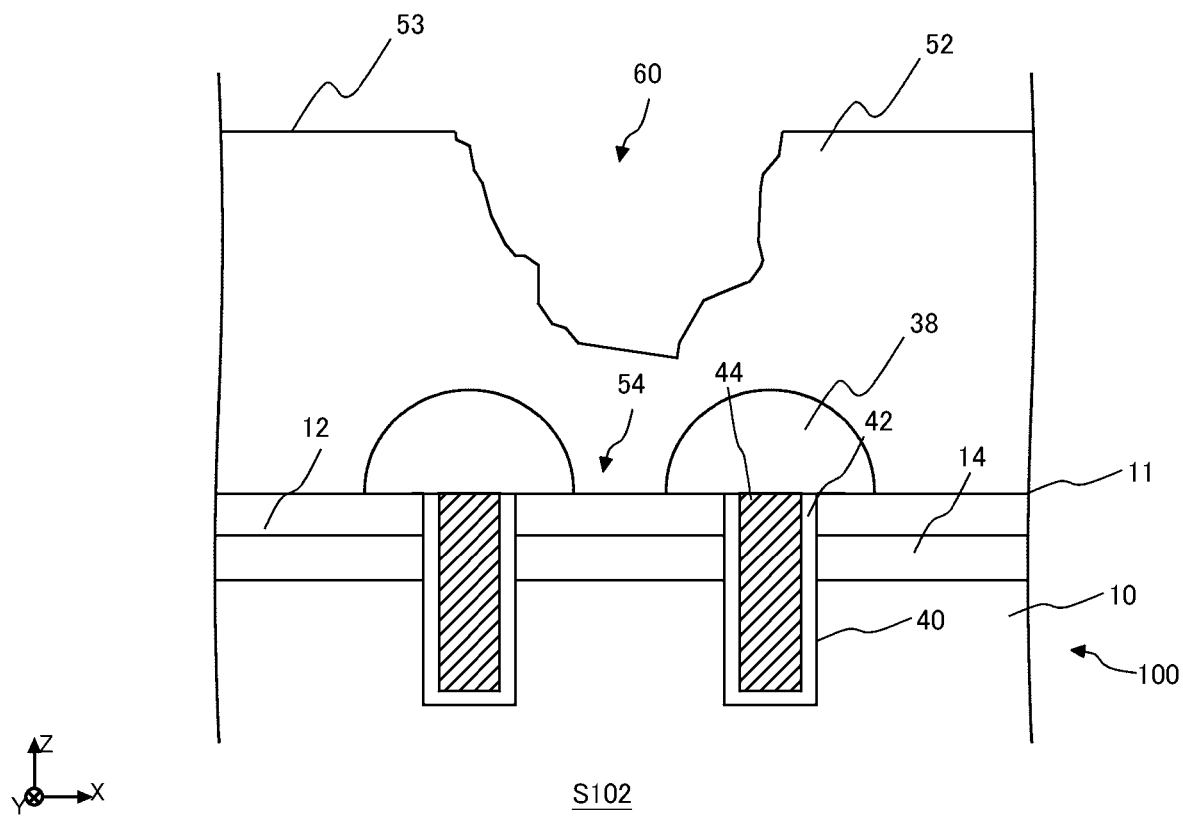
FIG. 5 is a diagram describing another example of the metal electrode forming step S102.
Figure 6:
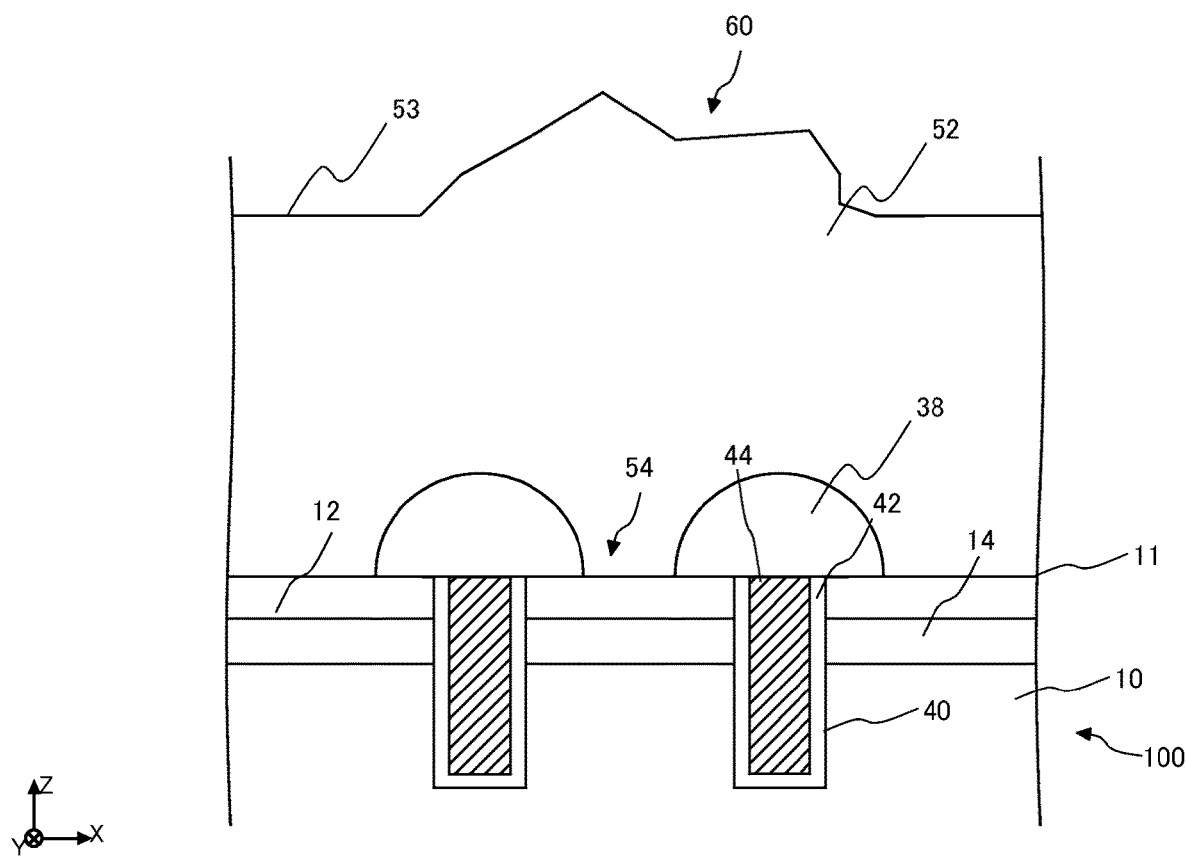
FIG. 6 is a diagram describing another example of the metal electrode forming step S102.

FIGS. 5 and 6 are diagrams describing another example of the metal electrode forming step S102. FIGS. 5 and 6 are different from FIG. 3, in that the surface 53 of the metal electrode 52 has a defect candidate 60. The other configurations of FIGS. 5 and 6 may be the same as those of FIG. 3.

As used herein, a defect is an unevenness on the surface 53 of the metal electrode 52. During screening, the semiconductor device 100 is determined as being defective if an unevenness satisfying a predetermined condition is found. The defect candidate 60 is a candidate for unevenness that satisfies the predetermined condition.

In FIG. 5, the defect candidate 60 of the metal electrode 52 has a concave shape. The description 'the defect candidate 60 of the metal electrode 52 has a concave shape' may indicate that a part of the surface 53 of the metal electrode 52 is missing or a part of the surface 53 of the metal electrode 52 is lower in a height direction (Z-axis direction) than the other part due to another cause. When the defect candidate 60 of the metal electrode 52 has a concave shape, a distance in the Z-axis direction from the surface 53 to a lower end of the defect candidate 60 is referred to as a depth of the defect candidate 60.

In FIG. 6, the defect candidate 60 of the metal electrode 52 has a convex shape. The description 'the defect candidate 60 of the metal electrode 52 has a convex shape' may indicate a state in which a part of the surface 53 of the metal electrode 52 is raised. For example, if a foreign substance such as a resist residue is present under the metal electrode 52, the metal electrode 52 may be locally raised. The description 'the defect candidate 60 of the metal electrode 52 has a convex shape' may indicate that a part of the surface 53 of the metal electrode 52 is higher in the height direction (Z-axis direction) than the other part. When the defect candidate 60 of the metal electrode 52 has a convex shape, a distance in the Z-axis direction from the surface 53 to an upper end of the defect candidate 60 is referred to as a height of the defect candidate 60.

As shown in FIG. 5, when the defect candidate 60 has a concave shape having a depth of a certain level or more, the plating solution enters the defect candidate 60 in the plated electrode forming step S105, and the movable ions in the plating solution diffuse into the semiconductor device 100, so that a characteristic defect may occur. It is also considered to detect the characteristic defect by applying a predetermined voltage to the gate electrode 44 of the semiconductor device 100 and performing electrical screening. However, even in a normal product, since the characteristics vary greatly when the semiconductor device 100 is turned on, it is difficult to detect the characteristic defect by the electrical screening. For this reason, it is preferable to perform a visual inspection of the surface 53 of the metal electrode 52 and to perform screening.

In the visual inspection screening, a shape, a color, and a size of the defect candidate 60 generated in the semiconductor device 100 are checked by an image or the like, and when determination criteria are satisfied, the defect candidate 60 is determined as being defective, as a defect. However, it is difficult to determine non-defective and defective products only with the information on the shape, color, and size of the defect candidate 60, and even the semiconductor device 100, which is originally non-defective, may be treated as being defective. For example, even in a case of a defect having a concave shape as in the defect candidate 60 of FIG. 5, if a depth thereof is a certain depth or less, a characteristic defect does not occur. In addition, even in a case of a defect having a convex shape as in the defect candidate 60 of FIG. 6, if a height thereof is a certain height or less, it is possible to estimate that there is no foreign substance under the metal electrode 52 or there is an extremely small foreign substance. Therefore, it is not problematic even if the semiconductor device 100 is treated as being non-defective. However, if the quality is determined only by the shape, color, and size of the defect candidate 60, the height or depth of the defect candidate 60 cannot be determined, so that the semiconductor device 100, which is originally non-defective, may be determined as being defective. The manufacturing method of the present example determines a quality of the semiconductor device 100, based on the height or depth of the defect candidate 60. Thereby, it is possible to reduce a probability that the semiconductor device 100, which is originally non-defective, will be erroneously determined as being defective, so that it is possible to improve a non-defective rate of the semiconductor device 100.

Figure 7:
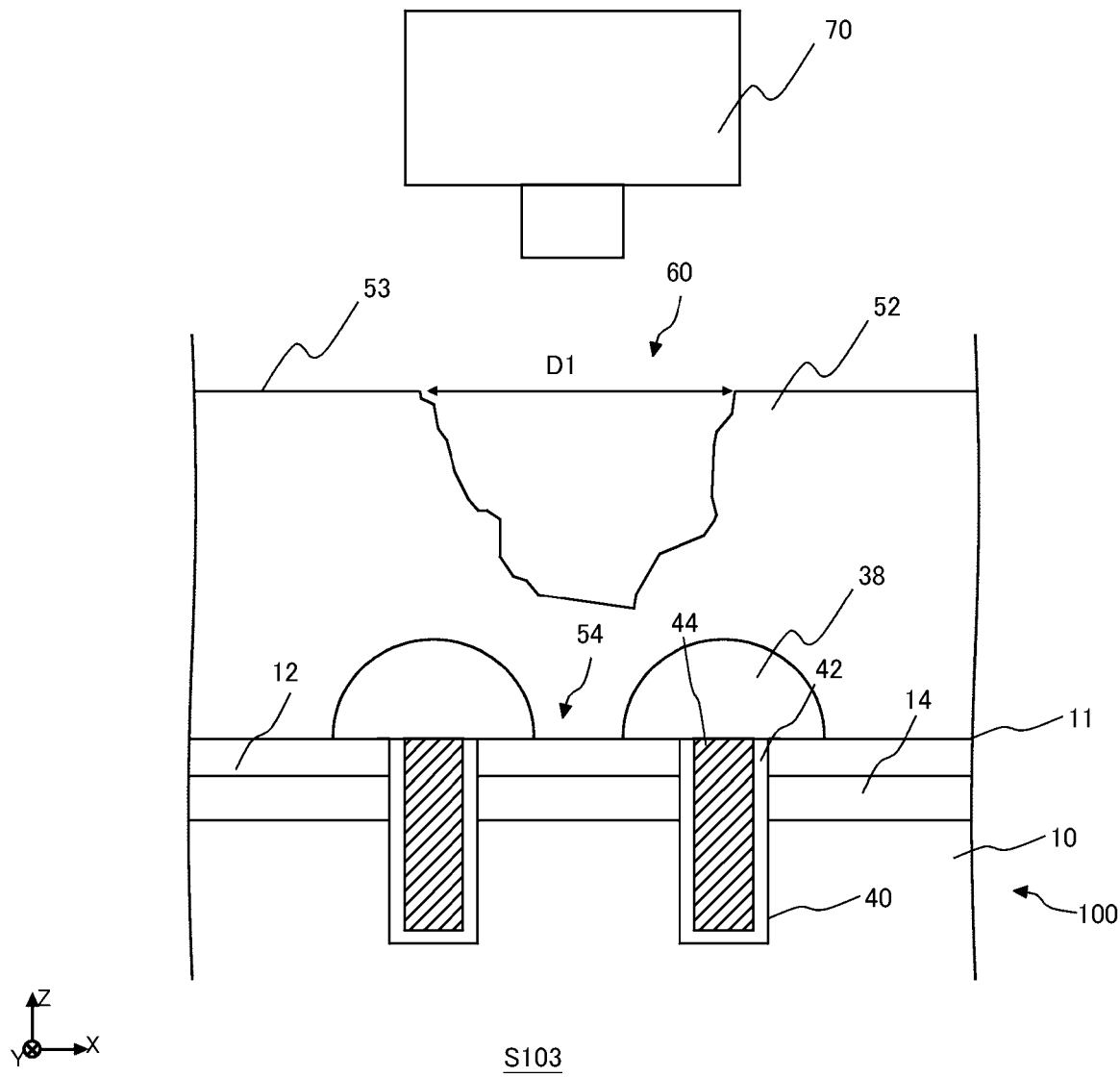
FIG. 7 is a diagram describing an example of a defect candidate detecting step S103 when a defect candidate 60 has a concave shape.

FIG. 7 is a diagram describing an example of the defect candidate detecting step S103 when the defect candidate 60 has a concave shape. In the present example, a case where the defect candidate 60 has a concave shape as shown in FIG. 5 will be described.

In the defect candidate detecting step S103, the defect candidate 60 on the surface 53 of the metal electrode 52 is detected. In the defect candidate detecting step S103, a device 70 detects the defect candidate 60. The device 70 is, for example, a visual inspection device. The device 70 may also have a CCD (Charge Coupled Device) camera.

In the defect candidate detecting step 103, the device 70 acquires an image of the metal electrode 52. In the defect candidate detecting step S103, the device 70 may detect the defect candidate 60 on the surface 53 of the metal electrode 52, based on the image of the metal electrode 52. For example, the device 70 acquires, from the image of the metal electrode 52, information on a shape, a color, and a size on the surface of an element included in the image and detects the defect candidate 60. The element included in the image is a portion having a predetermined contour in the image. The contour of the element can be identified by a difference in brightness or chromaticity between pixels. The device 70 may acquire any of the information on the shape, the color, and the size on the surface size of each element from the image of the metal electrode 52, or may acquire all of the information on the shape, the color, and the size of each element from the image of the metal electrode 52.

In the defect candidate detecting step S103, the device 70 may detect, as the defect candidate 60, an element whose size D1 on the surface 53 of the metal electrode 52 is a threshold value A1 or more. In the present example, the size D1 on the surface 53 of the metal electrode 52 is a size in the X-axis direction. The size D1 on the surface 53 of the metal electrode 52 may be the greatest width of the defect candidate 60 on an XY plane.

The threshold value A1 is 5 as an example. The threshold value A1 may be 5 μm or more. That is, in the defect candidate detecting step S103, the defect candidate 60 whose size D1 on the surface 53 of the metal electrode 52 is 5 μm or more may be detected. When the size D1 of the defect candidate 60 on the surface 53 of the metal electrode 52 is less than 5 μm, the defect candidate may not be regarded as the defect candidate 60.

In addition, in the defect candidate detecting step S103, the device 70 may detect the defect candidate 60 whose intensity of a predetermined color on the surface 53 of the metal electrode 52 is a predetermined threshold value or more. The intensity of a color may be the luminance of each color in a predetermined color space, such as the luminance of any color of the RGB colors in the RGB color space. As the intensity of the color of the defect candidate 60, an average value of the color in the defect candidate 60 may be used, or the maximum value may be used. In the defect candidate detecting step S103, the device 70 may detect the defect candidate 60 having a specific shape. For example, the device 70 may detect the defect candidate 60, based on a ratio of a width of the defect candidate 60 in a long axis direction and a width in a short axis direction. The long axis refers to a line, along which a length of the defect candidate 60 is the largest, of lines passing through the center of gravity of the two-dimensional shape of the defect candidate 60. The short axis refers to a line, along which a length of the defect candidate 60 is the smallest, of the lines passing through the center of gravity of the two-dimensional shape of the defect candidate 60. The device 70 may also detect the defect candidate 60, based on a degree of similarity to a preset shape. The degree of similarity in shape may be calculated by a known method. The device 70 may determine the defect candidate 60 by using all the information on the shape, color, and size of each element.

Figure 8:
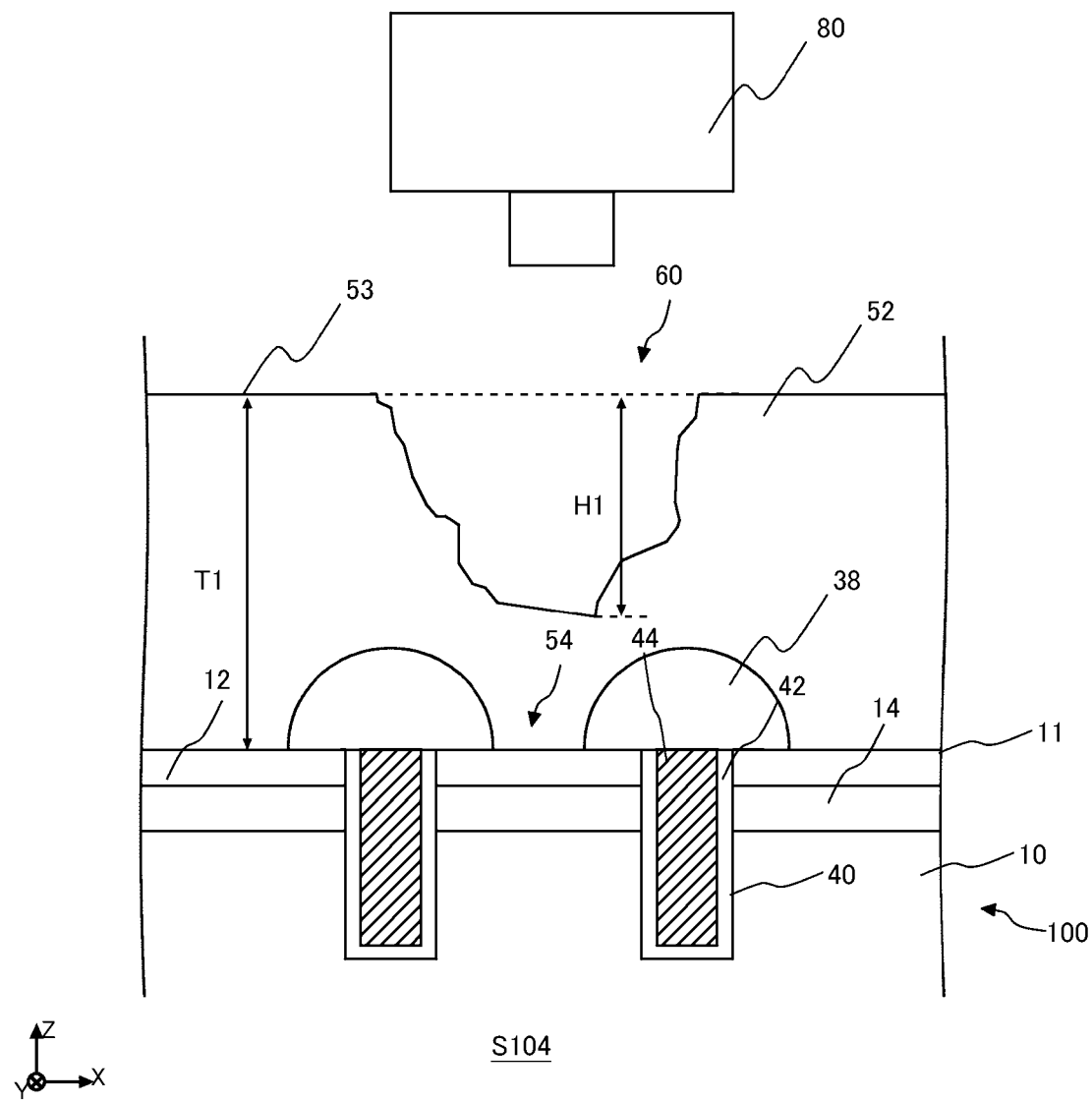
FIG. 8 is a diagram describing an example of an inspection step S104 when the defect candidate 60 has a concave shape.

FIG. 8 is a diagram describing an example of the inspection step S104 when the defect candidate 60 has a concave shape. In the present example, a case where the defect candidate 60 has a concave shape as shown in FIG. 5 is described.

In the inspection step S104, a device 80 determines the quality of the semiconductor device 100. The device 80 is, for example, a visual inspection device. The device 80 may also be the same as the device 70.

In the present example, the device 80 determines the quality, based on the height (or depth) information of each of the detected defect candidates 60 in a direction perpendicular to the surface 53 of the metal electrode 52. In the present specification, both "height" and "depth" may be simply referred to as "height". That is, when referring to "height", it may include both a "height" upward from the surface 53 and a "depth" downward from the surface 53. In FIG. 8, the height information is the height or depth information in the Z-axis direction. The method of measuring the height information is described with reference to FIGS. 12 and 13.

Conventionally, the semiconductor device 100 is determined as being non-defective or defective only with the information on the shape, color, and size on the surface of the defect candidate 60. However, in the present example, in addition to the information on the shape, color, and size on the surface of the defect candidate 60, the height information is used to determine whether the semiconductor device 100 is non-defective or defective. Accordingly, it is possible to improve screening accuracy.

A specific inspection method is described. In the present example, in the inspection step S104, it is determined whether the defect candidate 60 of the metal electrode 52 has a concave shape or a convex shape. Then, in the inspection step S104, the quality determination criterion as to the height information is changed based on the shape of the defect candidate 60. That is, in the inspection step S104, a reference value to be compared with the height information may be changed based on the shape of the defect candidate 60. An example of the reference value will be described later. That is, a quality determination criterion when the defect candidate 60 has a concave shape and a quality determination criterion when the defect candidate 60 has a convex shape are respectively set. As described with reference to FIGS. 5 and 6, the type of the defective is different depending on whether the defect candidate 60 has a concave shape or a convex shape. Therefore, a quality determination criterion of the semiconductor device 100 is set depending on whether the defect candidate 60 has a concave shape or a convex shape, so that the screening accuracy can be improved.

In FIG. 8, a case where the defect candidate 60 of the metal electrode 52 has a concave shape is described. When the defect candidate 60 of the metal electrode 52 has a concave shape, a first determination criterion, a second determination criterion and a third determination criterion are respectively described.

As the first determination criterion, in the inspection step S104, the quality of the semiconductor device 100 may be determined based on whether the concave shape is above the upper end of the interlayer insulating film 38. For example, when the concave shape of the defect candidate 60 is not above the upper end of the interlayer insulating film 38, i.e., when the defect candidate 60 is formed deeper than the height position of the upper end of the interlayer insulating film 38, the semiconductor device 100 may be determined as being defective. When the concave shape is above the upper end of the interlayer insulating film 38, i.e., when the defect candidate 60 is shallower than the height position of the upper end of the interlayer insulating film 38, the semiconductor device 100 may be determined as being non-defective. When the defect candidate 60 is above the upper end of the interlayer insulating film 38, the defect candidate 60 does not affect the interlayer insulating film 38. Therefore, by providing such criterion, it is possible to improve the screening accuracy.

As the second determination criterion, in the inspection step S104, the quality of the semiconductor device 100 may be determined based on comparison between a depth H1 of the defect candidate 60 of the metal electrode 52 and a threshold value A4 based on a thickness T1 of the metal electrode 52. The threshold value A4 is an example of the reference value. That is, in the inspection step S104, the reference value to be compared with the depth H1 of the defect candidate 60 may be set to the threshold value A4. The depth H1 of the defect candidate 60 of the metal electrode 52 may be the maximum depth of the defect candidate 60 of the metal electrode 52. The thickness T1 of the metal electrode 52 may be an average thickness of the metal electrode 52.

The threshold value A4 is, for example, 40% of the thickness T1 of the metal electrode 52. That is, in the inspection step S104, the quality of the semiconductor device 100 may be determined based on whether the depth H1 of the defect candidate 60 of the metal electrode 52 is 40% or less of the thickness T1 of the metal electrode 52. For example, when the depth H1 of the defect candidate 60 of the metal electrode 52 is 40% or less of the thickness T1 of the metal electrode 52, the semiconductor device 100 may be determined as being non-defective. When the depth H1 of the defect candidate 60 of the metal electrode 52 is greater than 40% of the thickness T1 of the metal electrode 52, the semiconductor device 100 may be determined as being defective. Depending on the thickness T1 of the metal electrode 52, whether the defect candidate 60 of the metal electrode 52 affects the interlayer insulating film 38 changes. Therefore, it is preferable to determine the quality of the semiconductor device 100, based on the comparison with the threshold value A4 based on the thickness T1 of the metal electrode 52.

As the third determination criterion, in the inspection step S104, the quality of the semiconductor device 100 may be determined based on whether a distance between the defect candidate 60 of the metal electrode 52 and the interlayer insulating film 38 is equal to or greater than the threshold value A3. The distance between the defect candidate 60 of the metal electrode 52 and the interlayer insulating film 38 may be the shortest distance on the XY plane. In the present example, the distance between the defect candidate 60 of the metal electrode 52 and the interlayer insulating film 38 is 0 μm because the defect candidate 60 of the metal electrode 52 is present above the interlayer insulating film 38 (that is, overlaps, in the top view of the XY plane).

The threshold value A3 is 10 μm, as an example. That is, in the inspection step S104, the quality of the semiconductor device 100 may be determined based on whether the distance between the defect candidate 60 of the metal electrode 52 and the interlayer insulating film 38 is equal to or greater than the threshold value A3. For example, when the distance between the defect candidate 60 of the metal electrode 52 and the interlayer insulating film 38 is 10 μm or more, the semiconductor device 100 may be determined as being non-defective, regardless of the height information of the defect candidate 60. When the distance between the defect candidate 60 of the metal electrode 52 and the interlayer insulating film 38 is less than 10 μm, the semiconductor device 100 may be determined based on the height information of the defect candidate 60. When the distance between the defect candidate 60 of the metal electrode 52 and the interlayer insulating film 38 is 10 µm or more, the defect candidate 60 does not affect the interlayer insulating film 38. Therefore, by providing such criterion, it is possible to improve the screening accuracy.

In the determination using the height information of the first determination criterion, the second determination criterion and the like, only any determination criterion may be determined, or all the determination criteria may be implemented. The defect candidate 60 satisfying the third determination criterion may be determined by using the height information.

Figure 9:
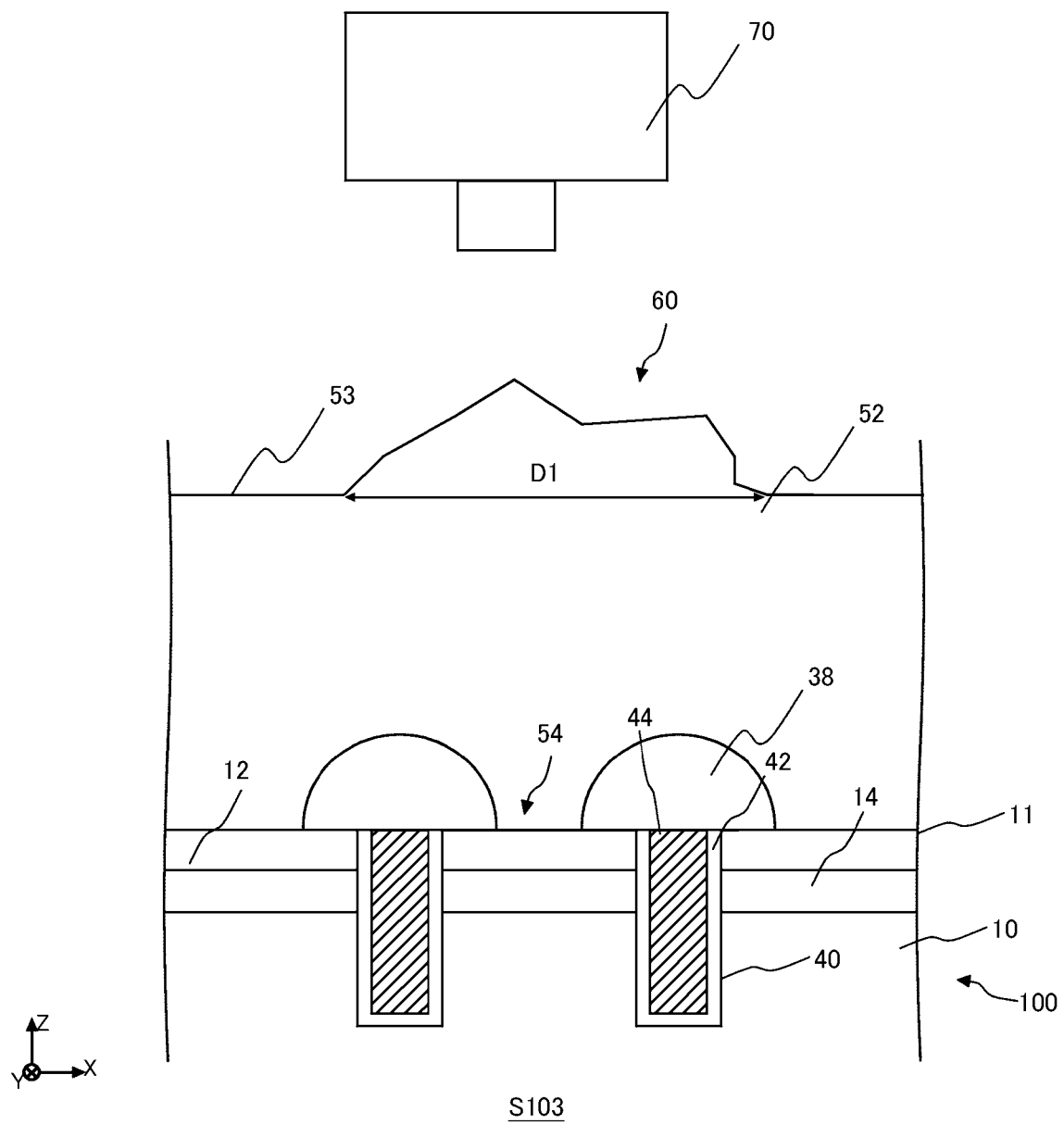
FIG. 9 is a diagram describing an example of the defect candidate detecting step S103 when the defect candidate 60 has a convex shape.

FIG. 9 is a diagram describing an example of the defect candidate detecting step S103 when the defect candidate 60 has a convex shape. FIG. 9 is the same as FIG. 7, except that the defect candidate 60 has a convex shape. In the defect candidate detecting step S103, when the size D1 on the surface 53 of the metal electrode 52 of the defect candidate 60 is 5 µm or less, as in FIG. 9, the defect candidate may not be regarded as the defect candidate 60.

Figure 10:
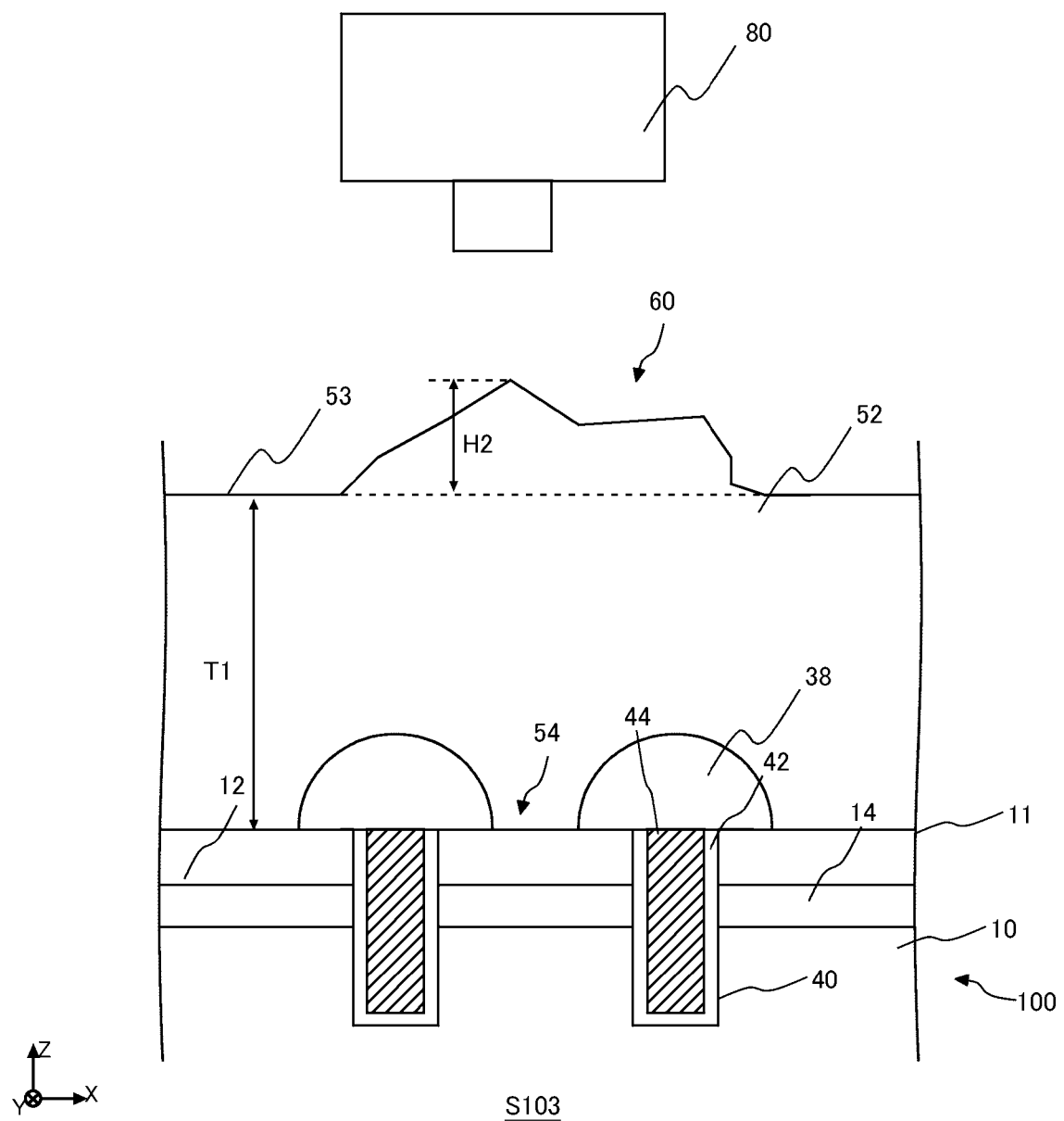
FIG. 10 is a diagram describing an example of the inspection step S104 when the defect candidate 60 has a convex shape.

FIG. 10 is a diagram describing an example of the inspection step S104 when the defect candidate 60 has a convex shape. In the present example, a case where the defect candidate 60 has a convex shape as shown in FIG. 6 is described.

As a fourth determination criterion, in the inspection step S104, the quality of the semiconductor device 100 may be determined based on comparison between a height H2 of the defect candidate of the metal electrode 52 and a certain threshold value A5. The height H2 of the defect candidate 60 of the metal electrode 52 may be the maximum height of the defect candidate 60 of the metal electrode 52. The threshold value A5 is an example of the reference value. That is, in the inspection step S104, the reference value may be changed to the threshold value A5.

The threshold value A5 is, 4 as an example. That is, in the inspection step S104, the quality of the semiconductor device 100 may be determined based on whether the height H2 of the defect candidate 60 of the metal electrode 52 is 4 µm or more. For example, when the height H2 of the defect candidate 60 of the metal electrode 52 is 4 µm or more, the semiconductor device 100 may be determined as being defective. When the height H2 of the defect candidate 60 of the metal electrode 52 is less than 4 µm, the semiconductor device 100 may be determined as being non-defective. In a case where the defect candidate 60 has a convex shape, if the height H2 of the defect candidate 60 of the metal electrode 52 is too high, it causes a defect. Therefore, the height H2 of the defect candidate 60 of the metal electrode 52 may be compared with the certain threshold value A5, regardless of the thickness T1 of the metal electrode 52. Such setting can improve the screening accuracy.

Figure 11:
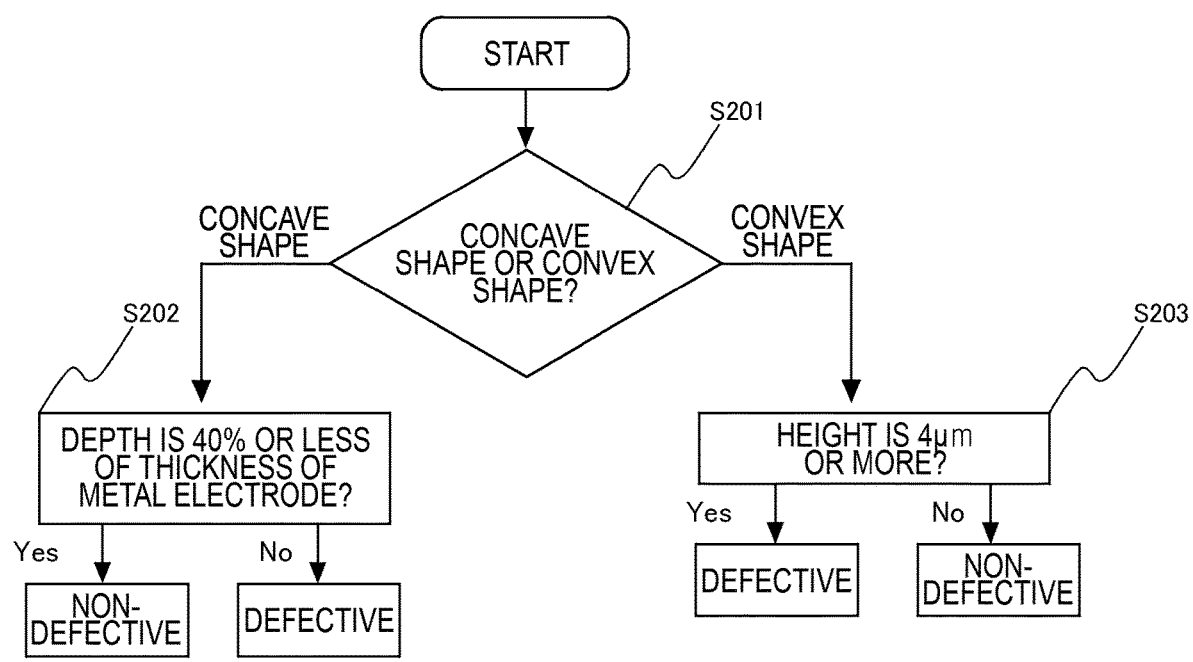
FIG. 11 shows an example of a flowchart of the inspection step S104.

FIG. 11 shows an example of a flowchart of the inspection step S104. First, it is determined whether the defect candidate 60 of the metal electrode 52 has a concave shape or a convex shape (S201). Next, when the defect candidate 60 of the metal electrode 52 has a concave shape, the quality of the semiconductor device 100 is determined with the above-described second determination criterion (S202). In addition, when the defect candidate 60 of the metal electrode 52 has a convex shape, the quality of the semiconductor device 100 is determined with the above-described fourth determination criterion (S203). In this way, by changing the determination criterion depending on whether the defect candidate 60 of the metal electrode 52 has a concave shape or a convex shape, it is possible to improve the screening accuracy. Further, in S202, only the semiconductor device 100 determined as being non-defective by the first determination criterion and the third determination criterion may also be determined as to the quality of the semiconductor device 100 by the second determination criterion.

Figure 12:
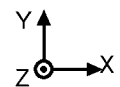
FIG. 12 is a diagram showing an example of a surface 53 of a metal electrode 52 demarcated by grids.
Figure 13:
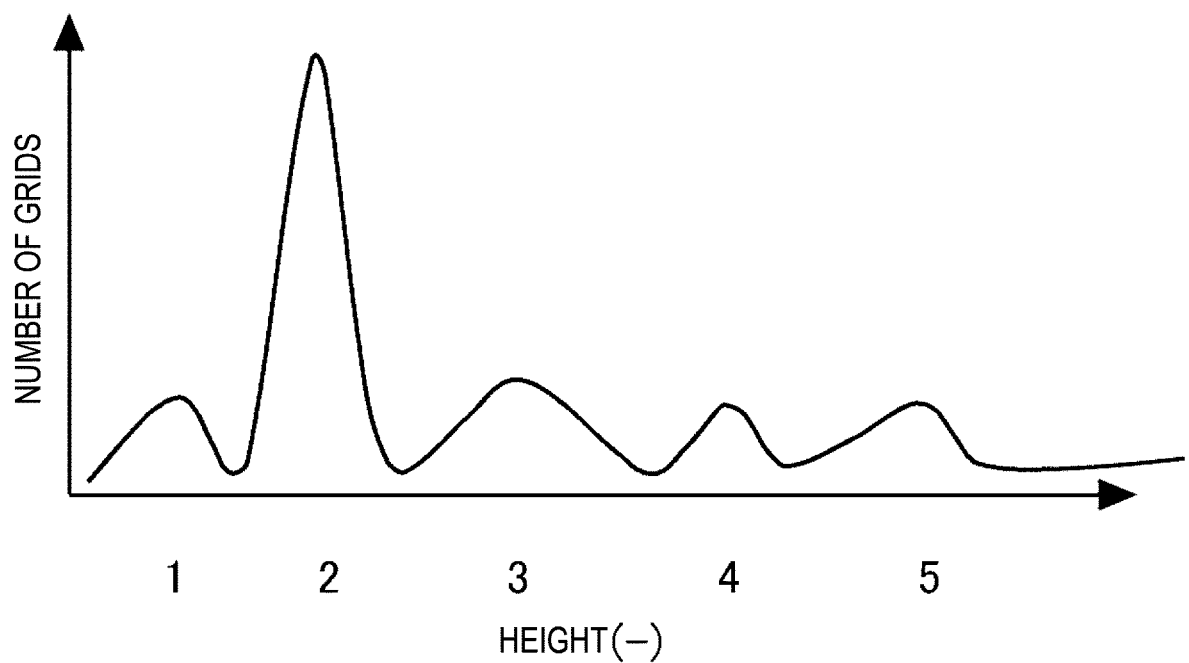
FIG. 13 is a diagram showing a distribution of heights and a number of grids.

FIGS. 12 and 13 are diagrams describing a method of measuring the height information of the defect candidate 60. FIG. 12 is a diagram showing an example of the surface 53 of the metal electrode 52 demarcated by grids. FIG. 13 is a diagram showing a distribution of heights and a number of grids.

First, as shown in FIG. 12, the surface 53 of the metal electrode 52 is demarcated by grids. Next, a height of each grid is measured. In the present example, the height of each grid is measured by the vertical scanning type low coherence interference method. For example, each grid is irradiated with light from a low coherence light source such as a white light source. The light is split into light directed toward the metal electrode 52 and reference light not directed toward the metal electrode 52 by a beam splitter or the like. Then, the interference between the reflected light from the metal electrode 52 and the reference light is measured. A peak height of the interference intensity in each grid is measured, and a height of the surface 53 in each grid is measured. A magnitude of a value of the peak height of the interference intensity corresponds to the height of the surface 53. The heights of the respective grids may be represented by discrete values. In the present example, the height of each grid is represented by an integer of 1 to 5. Then, as shown in FIG. 13, the height distribution of the respective grids is created. As shown by a peak position (2, in the present example) in FIG. 13, a height at which the number of grids indicating the height is the largest is defined as a reference height. The reference height corresponds to the height of the surface 53 of the metal electrode 52. A difference between the reference height and each height is used as the height information of each grid.

The above method is a length measuring method by the vertical scanning type low coherence interference method. However, the height information may also be measured by another method. The height information may also be measured by a laser displacement meter.

Figure 14:
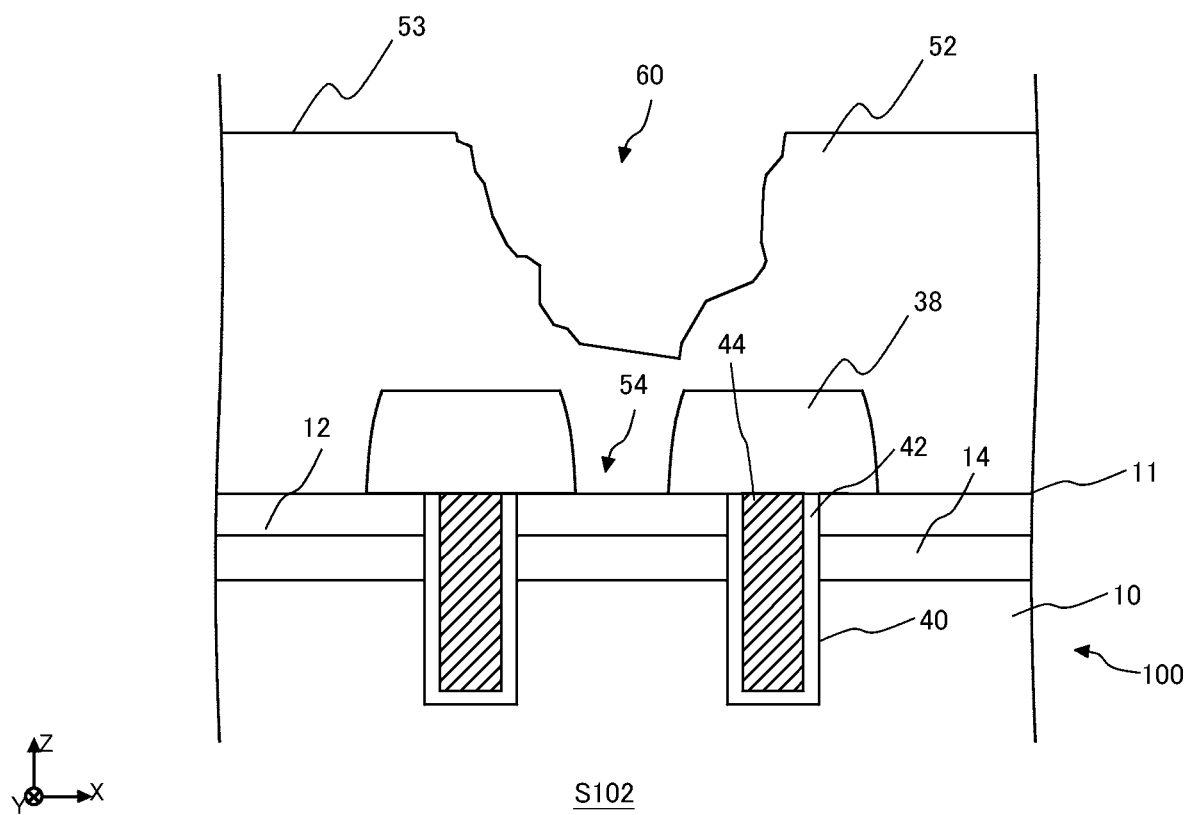
FIG. 14 is a diagram describing another example of the metal electrode forming step S102.

FIG. 14 is a diagram describing another example of the metal electrode forming step S102. FIG. 14 is different from FIG. 5, in that the interlayer insulating film 38 has a substantially rectangular shape. The other configurations of FIG. 14 may be the same as those of FIG. 5. Even when the interlayer insulating film 38 has a substantially rectangular shape, in the inspection step S104, the quality can be determined based on the height (or depth) information of each of the detected defect candidates 60 in the direction perpendicular to the surface 53 of the metal electrode 52.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: semiconductor substrate, 11: upper surface, 12: source region, 14: base region, 38: interlayer insulating film, 40: trench, 42: gate insulating film, 44: gate electrode, 52: metal electrode, 53: surface, 54: contact hole, 56: plated electrode, 60: defect candidate, 70: device, 80: device, 100: semiconductor device

What is claimed is:

1. A manufacturing method of a semiconductor device having a semiconductor substrate, the manufacturing method comprising:
    forming an interlayer insulating film above the semiconductor substrate;
    forming a metal electrode above the interlayer insulating film;
    acquiring an image of the metal electrode and detecting defect candidates on a surface of the metal electrode based on the image; and
    performing inspection by determining a quality of the semiconductor device, based on height information of each of the detected defect candidates in a direction perpendicular to the surface of the metal electrode,
    wherein in the performing inspection, it is determined whether the defect candidate of the metal electrode has a concave shape or a convex shape, and a quality determination criterion as to the height information is changed based on a shape of the defect candidate.

2. The manufacturing method of the semiconductor device according to claim 1, wherein
    in the performing inspection, a reference value to be compared with the height information is changed based on the shape of the defect candidate.

3. The manufacturing method of the semiconductor device according to claim 1, wherein
    in the performing inspection, when the defect candidate of the metal electrode has the concave shape, the quality of the semiconductor device is determined based on whether the concave shape is above an upper end of the interlayer insulating film.

4. The manufacturing method of the semiconductor device according to claim 3, wherein
    in the performing inspection, the quality of the semiconductor device is determined based on whether a distance between the defect candidate of the metal electrode and the interlayer insulating film is 10 µm or more.

5. The manufacturing method of the semiconductor device according to claim 3, wherein
    in the performing inspection, the quality of the semiconductor device is determined based on comparison between a depth of the defect candidate of the metal electrode and a threshold value based on a thickness of the metal electrode.

6. The manufacturing method of the semiconductor device according to claim 5, wherein
    in the performing inspection, the quality of the semiconductor device is determined based on whether the depth of the defect candidate of the metal electrode is 40% or less of the thickness of the metal electrode.

7. The manufacturing method of the semiconductor device according to claim 1, wherein
    in the performing inspection, when the defect candidate of the metal electrode has the convex shape, the quality of the semiconductor device is determined based on comparison between a height of the defect candidate of the metal electrode and a certain threshold value.

8. The manufacturing method of the semiconductor device according to claim 7, wherein
    in the performing inspection, the quality of the semiconductor device is determined based on whether the height of the defect candidate of the metal electrode is 4 µm or more.

9. The manufacturing method of the semiconductor device according to claim 1, further comprising forming a plated electrode above the metal electrode after the determining.

10. The manufacturing method of the semiconductor device according to claim 1, wherein
    in the detecting, the defect candidate of the metal electrode whose size on the surface of the metal electrode is 5 µm or more is detected.

11. The manufacturing method of the semiconductor device according to claim 2, wherein
    in the performing inspection, when the defect candidate of the metal electrode has the concave shape, the quality of the semiconductor device is determined based on whether the concave shape is above an upper end of the interlayer insulating film.

12. The manufacturing method of the semiconductor device according to claim 4, wherein
    in the performing inspection, the quality of the semiconductor device is determined based on comparison between a depth of the defect candidate of the metal electrode and a threshold value based on a thickness of the metal electrode.

13. The manufacturing method of the semiconductor device according to claim 2, wherein
    in the performing inspection, when the defect candidate of the metal electrode has the convex shape, the quality of the semiconductor device is determined based on comparison between a height of the defect candidate of the metal electrode and a certain threshold value.

14. The manufacturing method of the semiconductor device according to claim 1, further comprising forming a plated electrode above the metal electrode after the determining.

15. The manufacturing method of the semiconductor device according to claim 2, further comprising forming a plated electrode above the metal electrode after the determining.

16. The manufacturing method of the semiconductor device according to claim 3, further comprising forming a plated electrode above the metal electrode after the determining.

17. The manufacturing method of the semiconductor device according to claim 4, further comprising forming a plated electrode above the metal electrode after the determining.

18. The manufacturing method of the semiconductor device according to claim 5, further comprising forming a plated electrode above the metal electrode after the determining.

19. An inspection method of a semiconductor device having a semiconductor substrate and a metal electrode provided above the semiconductor substrate, the inspection method comprising:
    acquiring an image of the metal electrode and detecting defect candidates on a surface of the metal electrode based on the image; and
    performing inspection by determining a quality of the semiconductor device, based on height information of each of the detected defect candidates in a direction perpendicular to the surface of the metal electrode,
    wherein in the performing inspection, it is determined whether the defect candidate of the metal electrode has a concave shape or a convex shape, and a quality determination criterion as to the height information is changed based on a shape of the defect candidate.

* * * * *